United States Patent [19]
Driscoll et al.

[11] Patent Number: 5,490,723
[45] Date of Patent: Feb. 13, 1996

[54] DISK ARRAY SUBSYSTEM FOR USE IN A DATA PROCESSING SYSTEM

[75] Inventors: Edward K. Driscoll, Westwood; Arthur R. Nigro, Hopkinton, both of Mass.; Thomas D. Fillio, Newton, N.H.

[73] Assignee: Data General Corporation, Westboro, Mass.

[21] Appl. No.: 191,039

[22] Filed: Feb. 3, 1994

Related U.S. Application Data

[62] Division of Ser. No. 80,310, Jun. 24, 1993, Pat. No. 5,343,357, which is a division of Ser. No. 935,110, Aug. 26, 1992, Pat. No. 5,247,427.

[51] Int. Cl.$^6$ ................................................ A47B 88/00
[52] U.S. Cl. ............................. 312/334.28; 312/223.1
[58] Field of Search ........................... 312/223.1, 9.56, 312/9.53, 334.28, 311

[56] References Cited

U.S. PATENT DOCUMENTS

| | | | |
|---|---|---|---|
| 2,758,904 | 8/1956 | Hansell et al. | 312/311 |
| 3,631,325 | 12/1971 | Wenz | 312/334.28 |
| 3,758,716 | 9/1973 | James et al. | |
| 4,232,356 | 11/1980 | Saunders et al. | |
| 4,277,120 | 7/1981 | Drake et al. | |
| 4,491,981 | 1/1985 | Welles et al. | |
| 4,700,275 | 10/1987 | Wood | |
| 4,746,304 | 5/1988 | Asai | |
| 4,899,254 | 2/1990 | Ferchau et al. | |
| 5,045,960 | 9/1991 | Eding | |
| 5,193,050 | 3/1993 | Dimmick et al. | |
| 5,251,096 | 10/1993 | Hosoi et al. | |

FOREIGN PATENT DOCUMENTS

| | | | |
|---|---|---|---|
| 421458 | 4/1991 | European Pat. Off. | |
| 0489592 | 1/1930 | Germany | 312/334.28 |

Primary Examiner—Peter M. Cuomo
Assistant Examiner—Gerald A. Anderson
Attorney, Agent, or Firm—Kriegsman & Kriegsman

[57] ABSTRACT

A disk drive module adapted for use in a data processing system, the system including first and second disk drive module guide plates. The disk drive module comprises an elongated, generally rectangular frame. The top wall of the frame includes a fin slidably insertable into a groove formed on the second guide plate, and the bottom wall of the frame includes a T-bar slidably insertable into a channel formed on the first guide plate. The T-bar includes a detent which releasably engages a pawl formed in the channel for securing the T-bar within the channel. A 3.5 inch disk drive and a regulator card are mounted within the frame. The regulator card is mounted on the frame for movement in three directions using bifurcated squeezable snaps inserted through oversized holes formed in the regulator card. Each snap includes a tab which limits upward movement of the card.

8 Claims, 16 Drawing Sheets

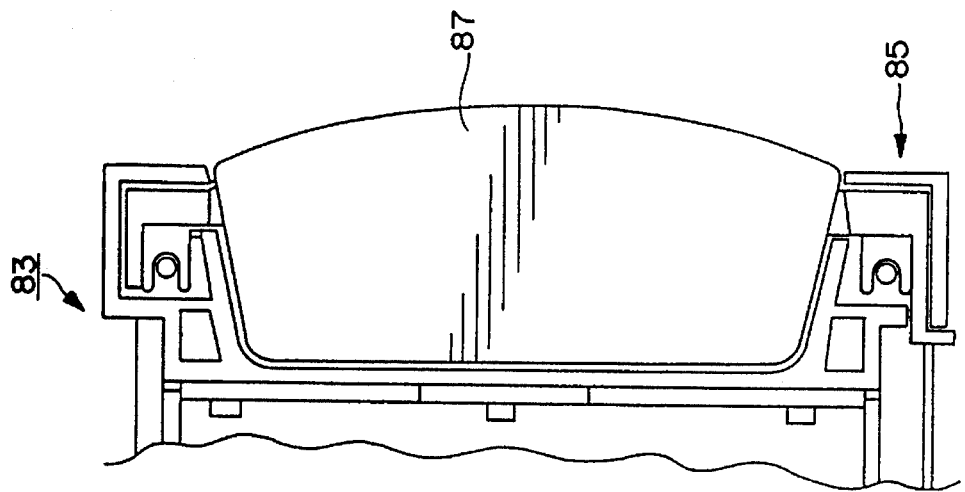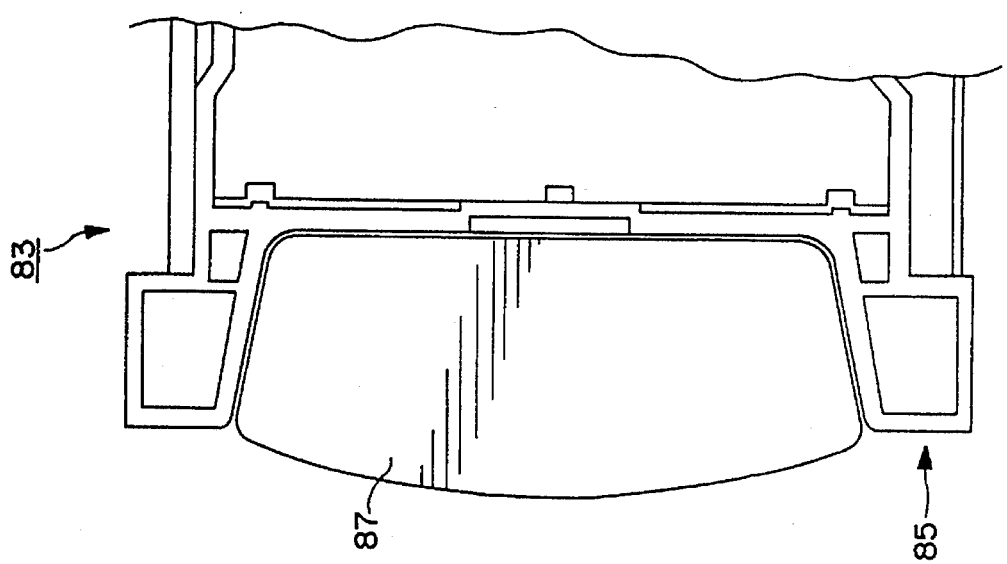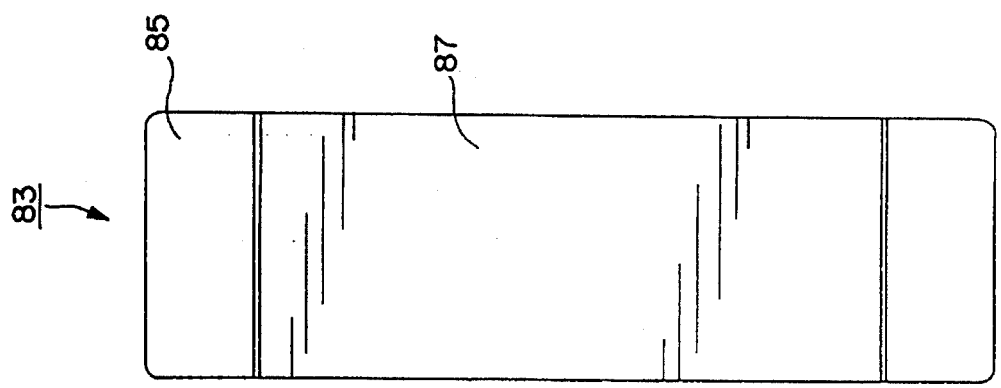

DISK ARRAY SUBSYSTEM FOR USE IN A DATA PROCESSING SYSTEM

This is a division of application Ser. No. 08/080,310, filed Jun. 24, 1993, now U.S. Pat. No. 5,343,357, which is a division of application Ser. No. 07/935,110, filed Aug. 26, 1992, now U.S. Pat. No. 5,247,427.

BACKGROUND OF THE INVENTION

The present invention relates generally to data processing systems and, more particularly, to a new and novel disk array subsystem for use in a data processing system.

One well known problem associated with data processing systems is computer system throughput, namely, the relatively slow rate at which mass storage devices are capable of accessing data.

Generally speaking, CPU's are capable of processing data much more quickly than mass storage devices are capable of delivering data. Consequently, a CPU often loses time, standing idle, while waiting for needed data to be transferred thereto from a mass storage device. As can readily be appreciated, this inefficiency frequently results in a waste of the tremendous horsepower of the CPU, which does not achieve maximum performance.

In the past, approaches utilizing disk caches and data base segmenting were developed to minimize this problem. However, none of these approaches met all of the requirements of a high-transaction processing environment.

Recently, subsystems comprising disk arrays, i.e., groups of small, independent disk drive modules used to store large quantities of data, have been developed and found to possess many advantages over a single large disk drive. For example, the individual modules of a disk array typically take up very little space and typically use less power and cost less than a single large disk drive, yet, when grouped together in an array, provide the same data storage capacity as a single large disk drive. In addition, the small disks of an array retrieve data more quickly than does a single large disk drive because, with a small disk drive, there is less distance for the actuator to travel and less data per individual disk to search through. The greatest advantage to small disk drives, however, is the boost they give to I/O performance when configured as a disk array subsystem.

In a disk array configuration, multiple drives process concurrent data retrieval/storage requests. Supported by a software "device driver" and individual controllers, the disks operate simultaneously. While one disk drive is retrieving/storing data, another can be sending data to the CPU. With several disks performing overlapped seeks, data can be retrieved and delivered more rapidly to the CPU. The CPU spends less time idle, so overall system performance improves substantially.

Examples of known disk array subsystems are the Data General Corp. High Availability Disk Array (H.A.D.A.) subsystem and the Data General Corp. Combined Storage Subsystem 2 (CSS2) subsystem. Both of these disk array subsystems use 5.25 inch disk drives.

Accordingly, it is an object of the present invention to provide a new and novel disk array subsystem.

It is another object of the present invention to provide a new and novel disk drive module for use in a disk array subsystem.

It is still another object of the present invention to provide a disk array subsystem having a plurality of disk drive modules and wherein the individual disk drive modules can be easily replaced when necessary.

It is still yet another object of the present invention to provide a disk array subsystem as described above whose size and shape conform to industry standards for purposes of modularity and, yet, which has the capacity to include a maximal number of disk drive modules.

It is a further object of the present invention to provide a disk array subsystem as described above which uses disk drive modules having 3.5 inch disk drives.

It is still a further object of the present invention to provide a disk array subsystem as described above which includes a chassis and a new and novel arrangement for slidably and removably mounting the disk drive modules in the chassis.

It is still yet a further object of the present invention to provide a disk array subsystem as described above which includes a new and novel arrangement for securing the disk drive modules in place within the chassis of the subsystem.

It is another object of the present invention to provide a disk array subsystem as described above which includes a new and novel arrangement for cooling the components contained in the disk array subsystem.

SUMMARY OF THE INVENTION

A disk array subsystem adapted for use in a data processing system according to this invention comprises a chassis, a backplane fixedly mounted inside said chassis, disk drive module guide plate means, said disk drive module guide plate means including a first guide plate having a plurality of parallel slotted channels, said first guide plate being fixedly mounted inside said chassis, a plurality of disk drive modules slidably and removably mounted on said first guide plate, each disk drive module including an elongated T-bar slidably mounted in one of said parallel slotted channels, said disk drive module guide plate means serving to support said disk drive modules and to place the disk drive modules mounted thereon in approximate alignment with said backplane for electrical connection therewith, controller means for controlling the operations of said disk drive modules, and power supply means for powering said disk drive modules.

According to one feature of the invention, each disk drive module and its associated slotted channel on the first guide plate include a pawl and detente combination for securing the disk drive module in place on its associated slotted channel.

According to another feature of the invention, each disk drive module contains a 3.5 inch disk drive, and twenty such disk drive modules are mounted in the chassis, the subsystem having an outer length of 19 inches and an outer width of 14 inches.

According to still another feature of the invention, the chassis is a generally rectangular box-like structure, and air circulating means are provided at the rear end thereof to move air longitudinally from the front end through the back end.

According to still yet another feature of the invention, the disk drive module includes a frame and a regulator card having an edge connector and wherein the regulator card is movably mounted on the frame so as to facilitate mating the edge connector with an associated connector on the backplane.

Various other objects, as well as features and advantages, of the present invention will be set forth in part in the description which follows, and in part will be obvious from the description or may be learned by practice of the invention. In the description, reference is made to the accompanying draiwngs which form a part thereof and in which is shown by way of illustration specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate various embodiments of the invention and, together with the description, serve to explain the principles of the invention. In the drawings wherein like reference numerals represent like parts:

FIG. 17 is a front view of an empty or filler disk drive module constructed according to the teachings of the present invention;

FIGS. 18(a) and 18(b) are right and left side views, respectively, of the filler disk drive module shown in FIG. 17;

DETAILED DESCRIPTION OF PREFERRED EMBODIMENTS

Figure 1:
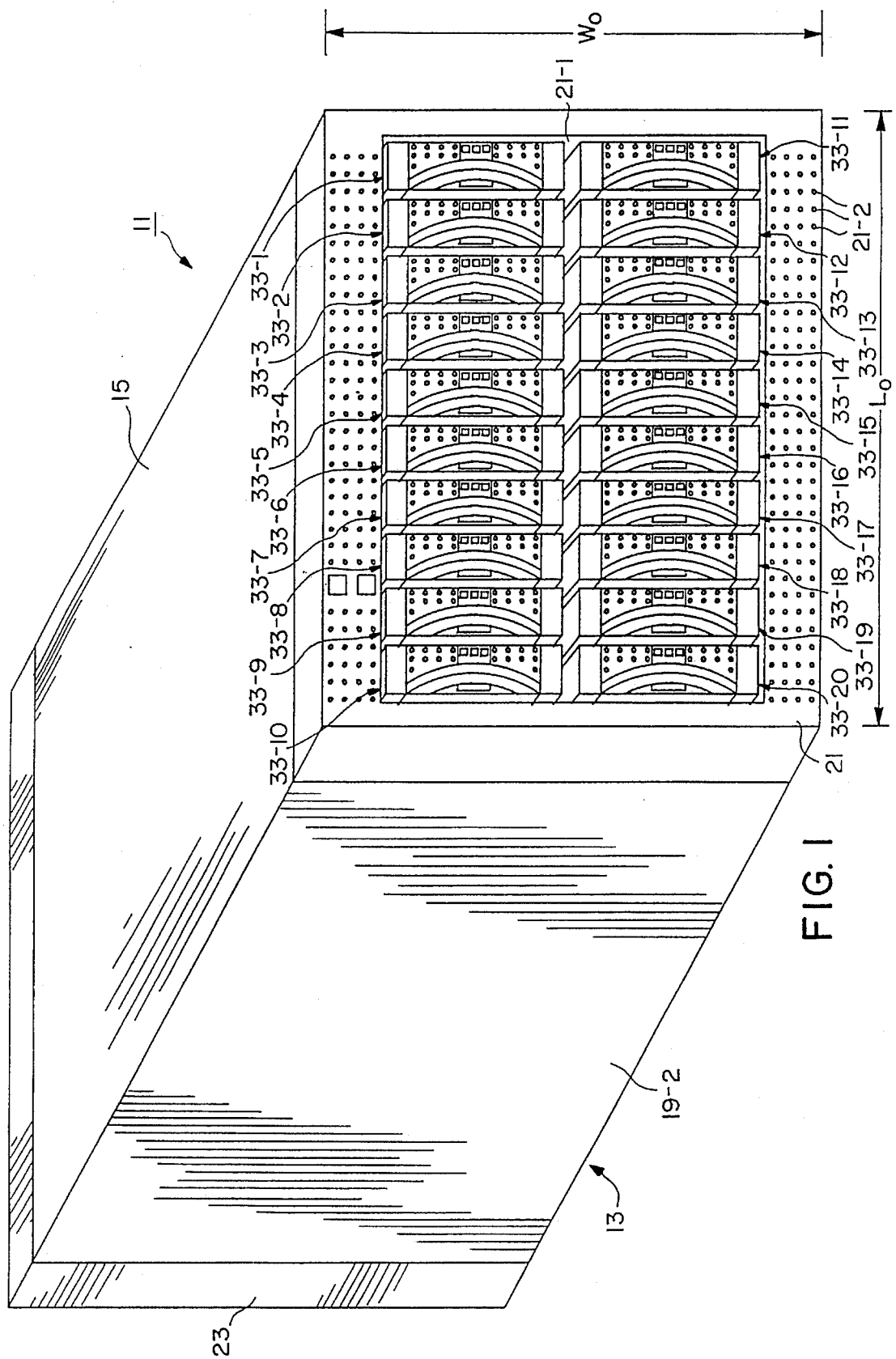
FIG. 1 is a perspective view of one embodiment of a disk array subsystem constructed according to the teachings of the present invention.
Figure 2:
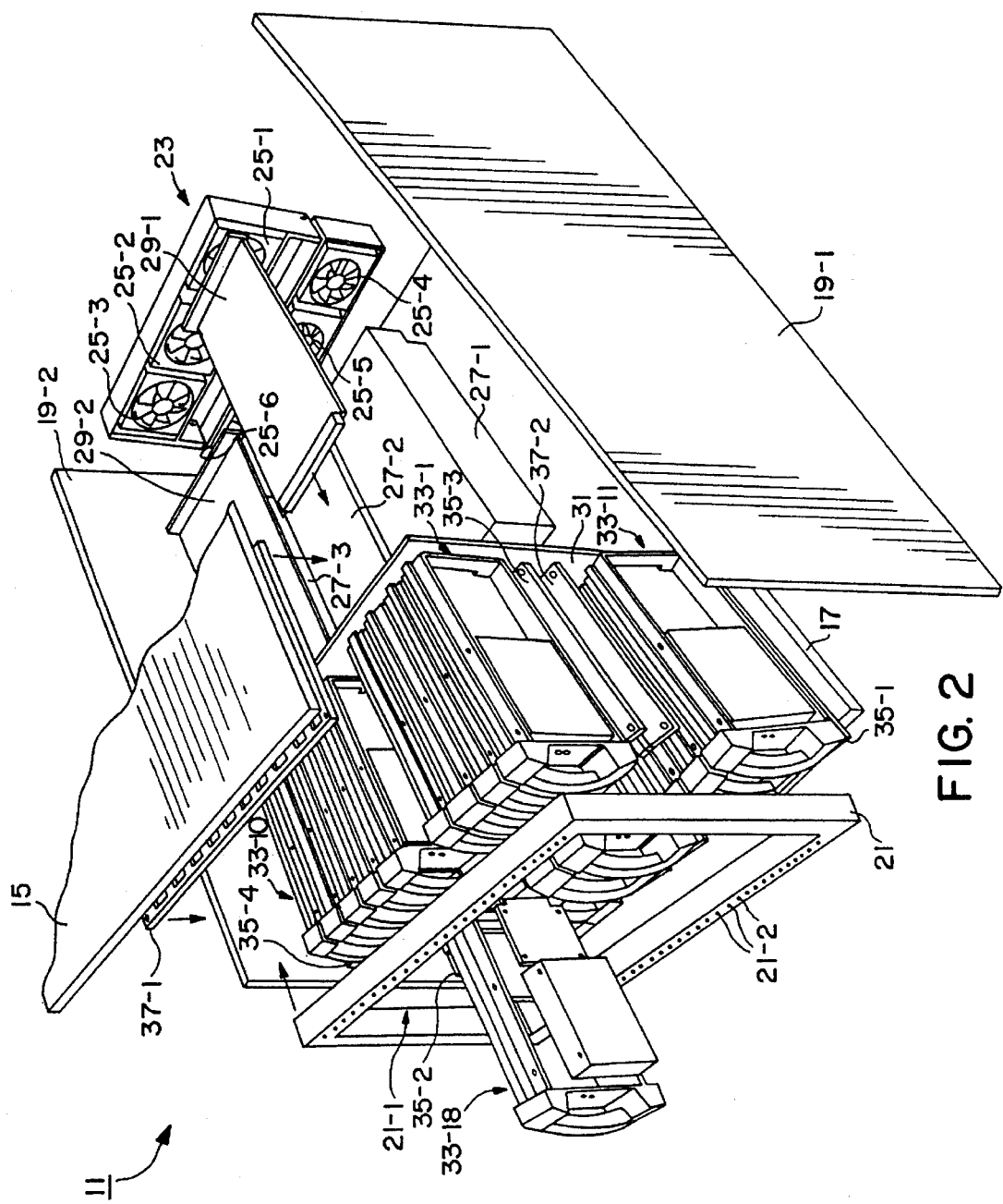
FIG. 2 is a simplified partially exploded front perspective view of the disk array subsystem shown in FIG. 2.
Figure 3:
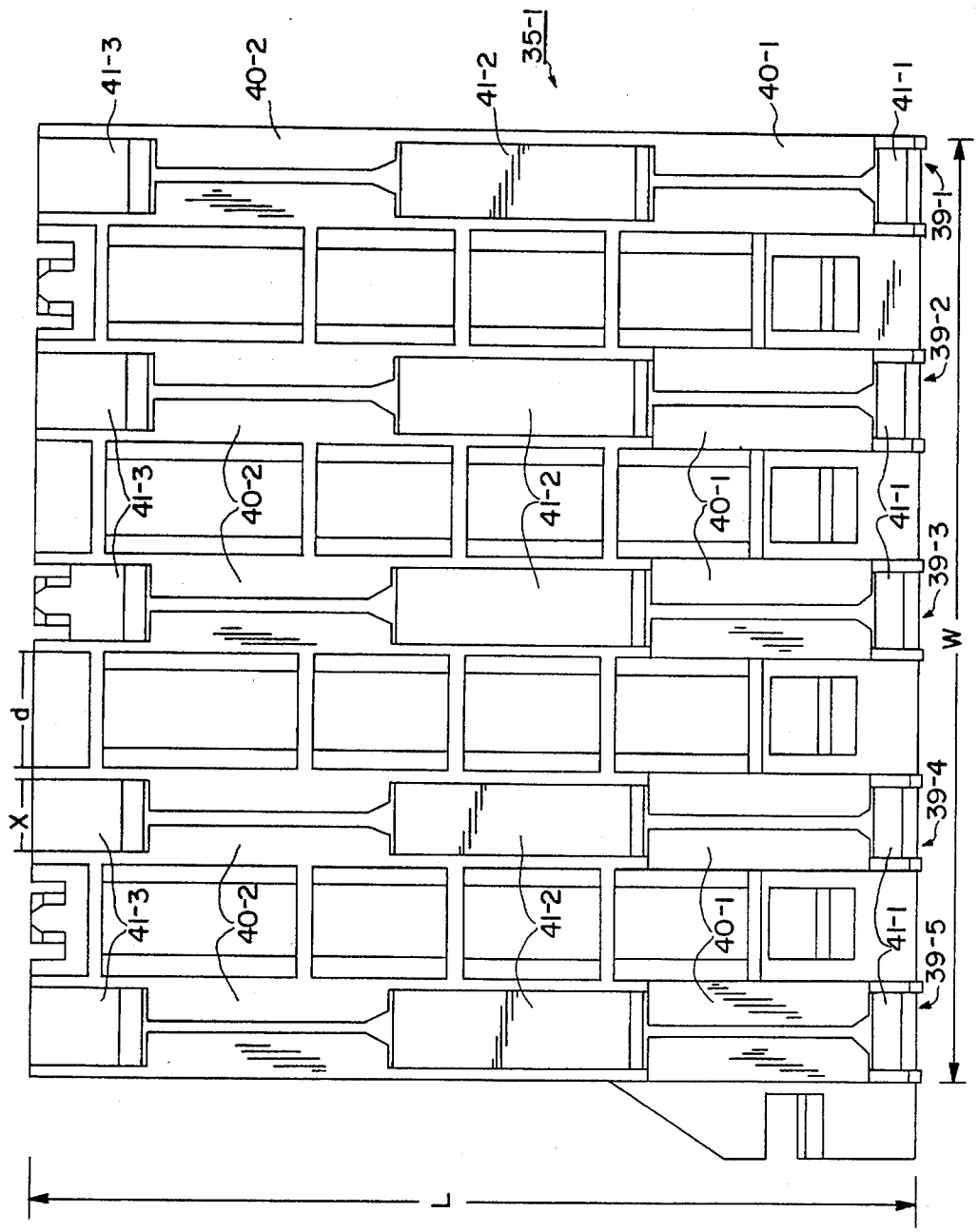
FIG. 3 is a top view of one of the first disk drive module guide plates shown in FIG. 2.
Figure 4:
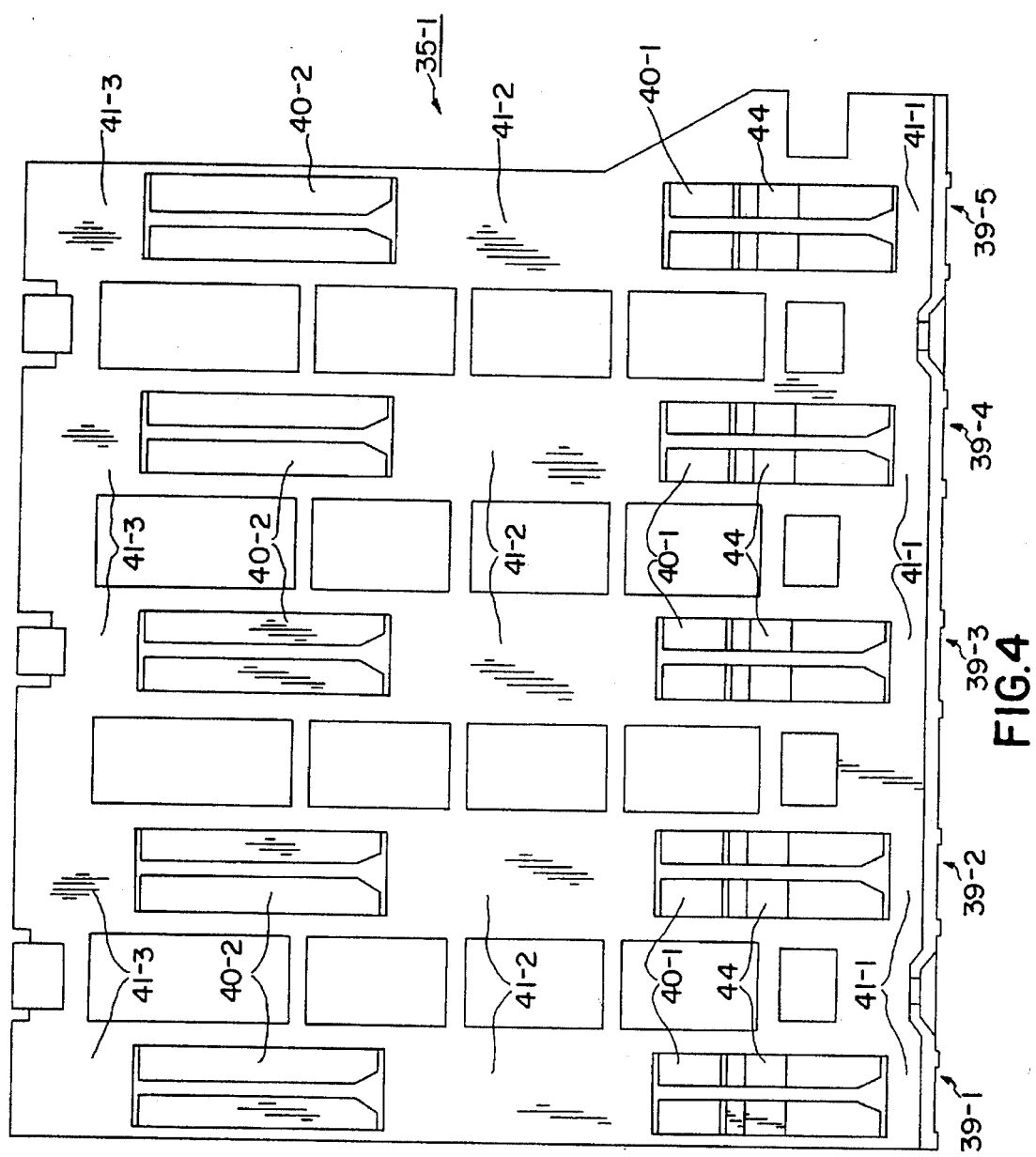
FIG. 4 is a bottom view of the first disk drive module guide plate shown in FIG. 3.
Figure 5:
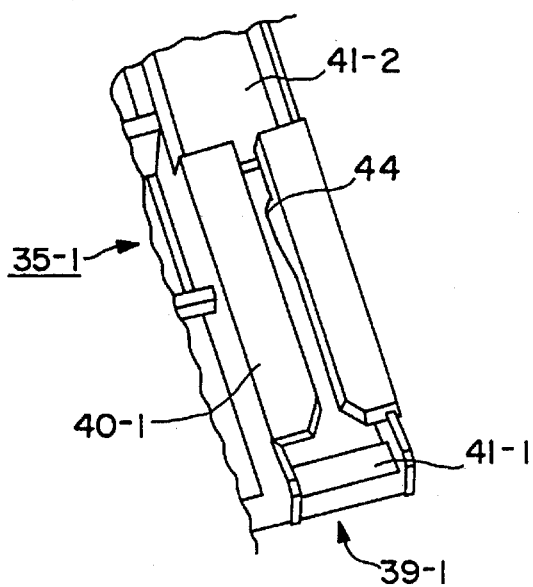
FIG. 5 is a fragmentary top view of the first disk drive module guide plate shown in FIG. 3.
Figure 6:
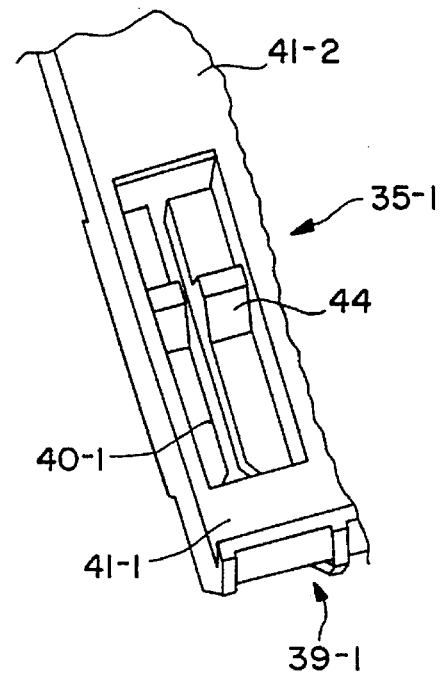
FIG. 6 is a fragmentary bottom view of the first disk drive module guide plate shown in FIG. 3.

Referring now to FIGS. 1 and 2, there is shown of one embodiment of a disk array subsystem adapted for use in a data processing system, the disk array subsystem being constructed according to the teachings of the present invention and being represented generally by reference numeral 11. Portions of subsystem 11 not pertinent to the invention are not shown.

Subsystem 11 comprises a generally rectangular hollow chassis 13 which is preferably made from metal or any other material having sufficient strength. Chassis 13 may be integrally formed or assembled from individual parts. Chassis 13 includes a top wall 15, a bottom wall 17, a pair of side walls 19-1 and 19-2, an open front end and an open rear end.

A generally rectangular open front panel 21 is fixedly mounted by any suitable means such as screws (not shown) over the front end of chassis 13. Panel 21 has a large rectangular opening 21-1 and a plurality of holes 21-2. A fan pack 23 is removably mounted over the rear end of chassis 13. Fan pack 23 includes a set of six exhaust fans 25-1 through 25-6 which are used to cool the contents of chassis 13 by drawing air in a generally unidirectional path through holes in the front end of chassis 13, such as holes 21-2 across the length thereof, and then out the rear end.

Disposed within chassis 13 are three power supplies 27-1 through 27-3, a pair of controller boards 29-1 end 29-2, a backplane 31, and a set of twenty identical disk drive modules 33-1 through 33-20.

Power supplies 27-1 through 27-3 ape electrically connected to the near surface of backplane 31 and provide power to subsystem 11. Controller boards 29-1 and 29-2 are electrically connected to the rear surface of backplane 31 and control the operations of subsystem 11. The specifics of how power supplies 27 supply power to the subsystem and how controller boards 29 control operations of the subsystem are not a part of this invention.

Power supplies 27-1 through 21-3 and controller boards 29-1 and 29-2 are slidably and removably mounted inside chassis 13 on supporting brackets (not shown).

Disk drive modules 33-1 through 33-20 are slidably and removably mounted in chassis 13 through opening 21-1 in two rows with ten modules 33 in each row. The structure for mounting modules 33 in chassis 13 includes four first disk drive module guide plates 35-1 through 35-4 and two second disk drive module guide plates 37-1 and 37-2, all of which are horizontally disposed in chassis 13. Guide plates 35-1 and 35-2 are fixedly mounted on bottom wall 17 by screws (not shown) and guide plate 37-1 is fixedly mounted on top wall 15 by screws (not shown). Guide plate 37-2 is fixedly mounted on side walls 19 by screws (not shown) and guide plates 35-3 and 35-4 are fixedly mounted on top of second guide plate 37-2 by screws (not shown). Each disk drive module 33 is slidably mounted on a first guide plate 35 and a second guide plate 37. In addition to serving to mount disk drive modules 33 in chassis 13, guide plates 35 and 37 also serve to place disk drive modules 33 in approximate alignment with backplane 31 for electrical connection therewith.

First disk drive module guide plate 35-1 is shown in greater detail in FIGS. 3 through 7. As can be seen, plate 35-1 is a unitary generally rectangularly molded structure made of plastic and shaped to define five longitudinally disposed parallel channels 39-1 through 39-5. Each channel 39 includes a top wall having two sections 40-1 and 40-2, each of which is slotted, and a bottom wall having three sections 41-1, 41-2 and 41-3. The bottom side of section 40-1 of the top wall is shaped to define a pawl 44. First disk drive module guide plates 35-2 through 35-4 are identical in construction to first disk module drive guide plate 35-1.

Figure 7:
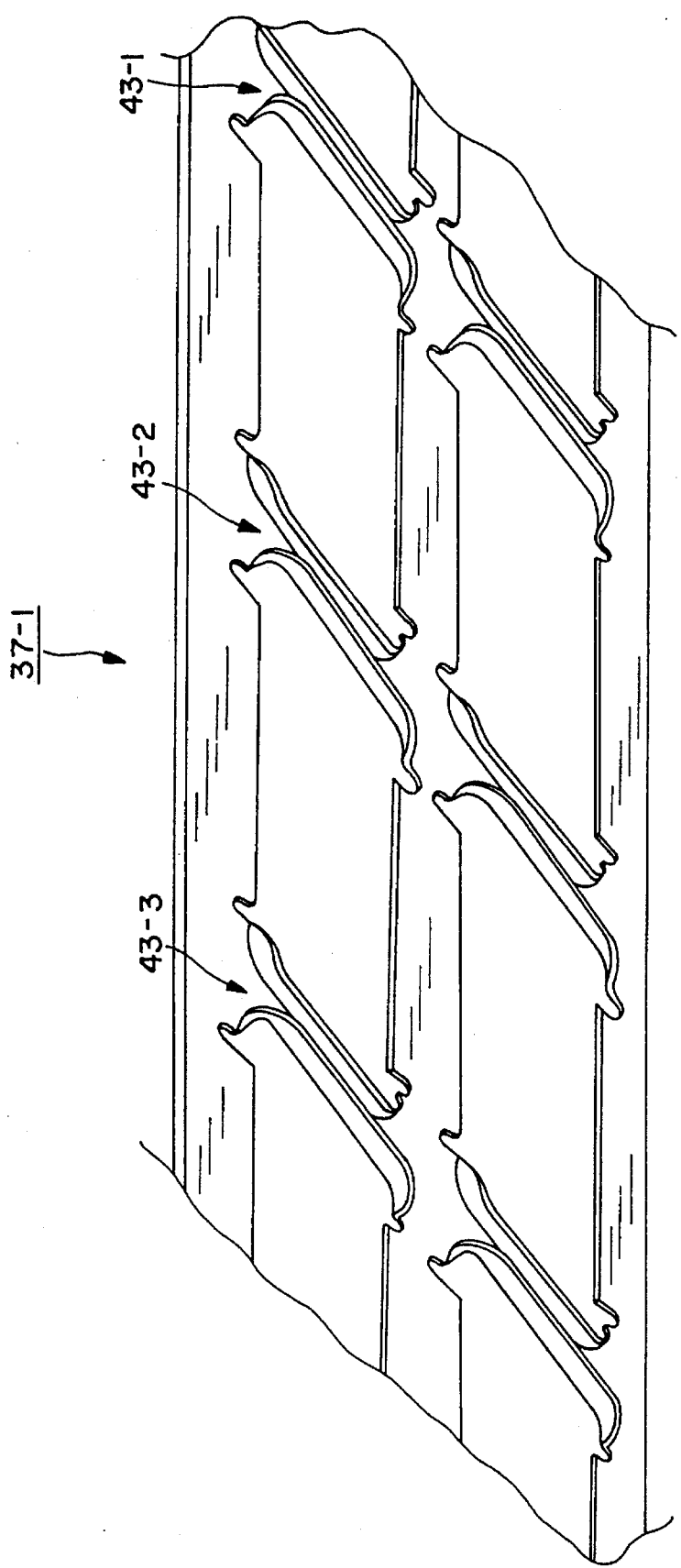
FIG. 7 is a fragmentary bottom perspective view of one of the second disk drive module guide plates shown in FIG. 2.

Second disk drive module guide plate 37-1, a portion of which is shown in detail in FIG. 7, is a generally rectangular plate having ten longitudinally disposed parallel grooves 43. Three such grooves 43 are shown in FIG. 7 and are labelled 43-1 through 43-3.

Figure 8:
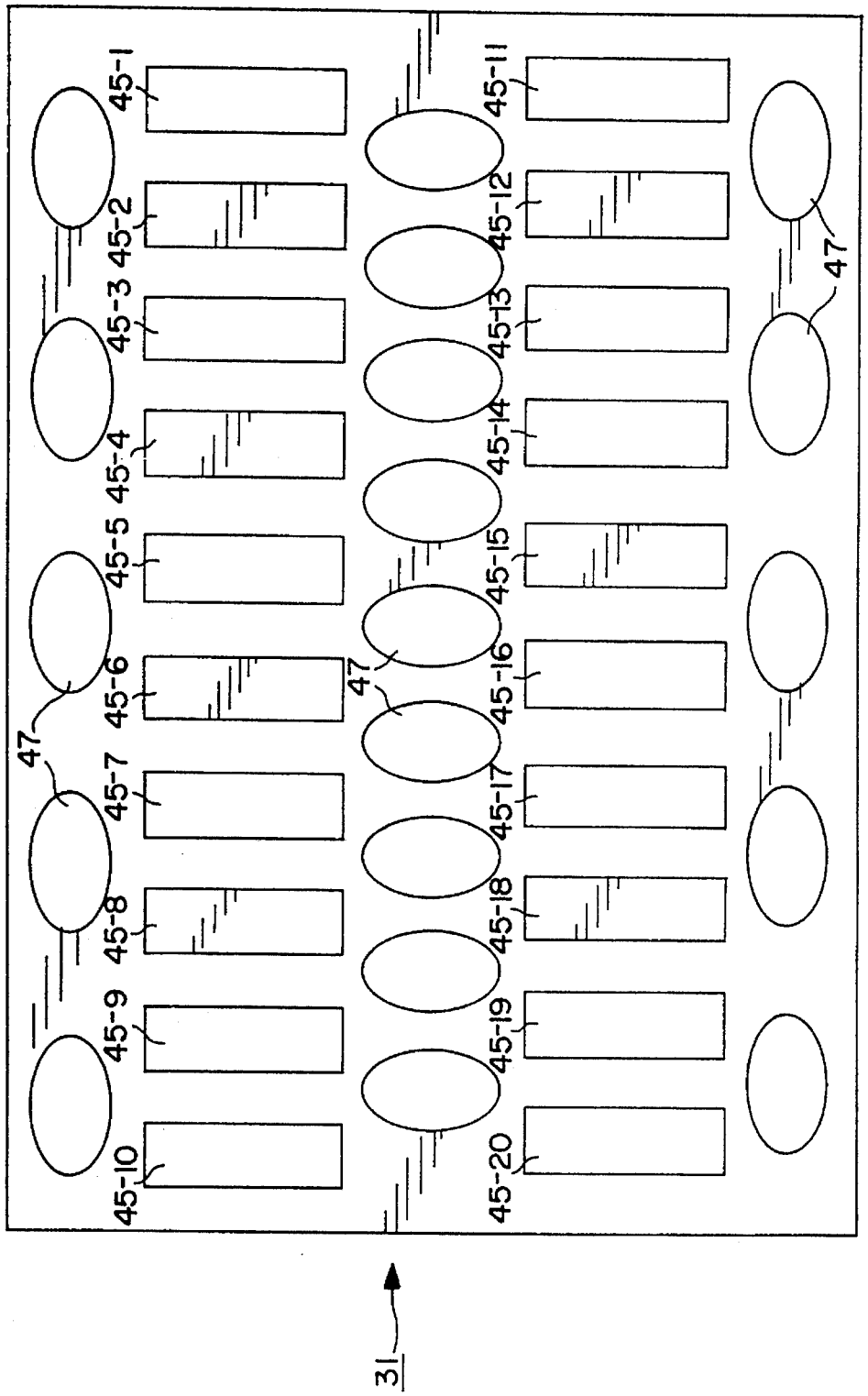
FIG. 8 is a front view of the backplane shown in FIG. 2.
Figure 9:
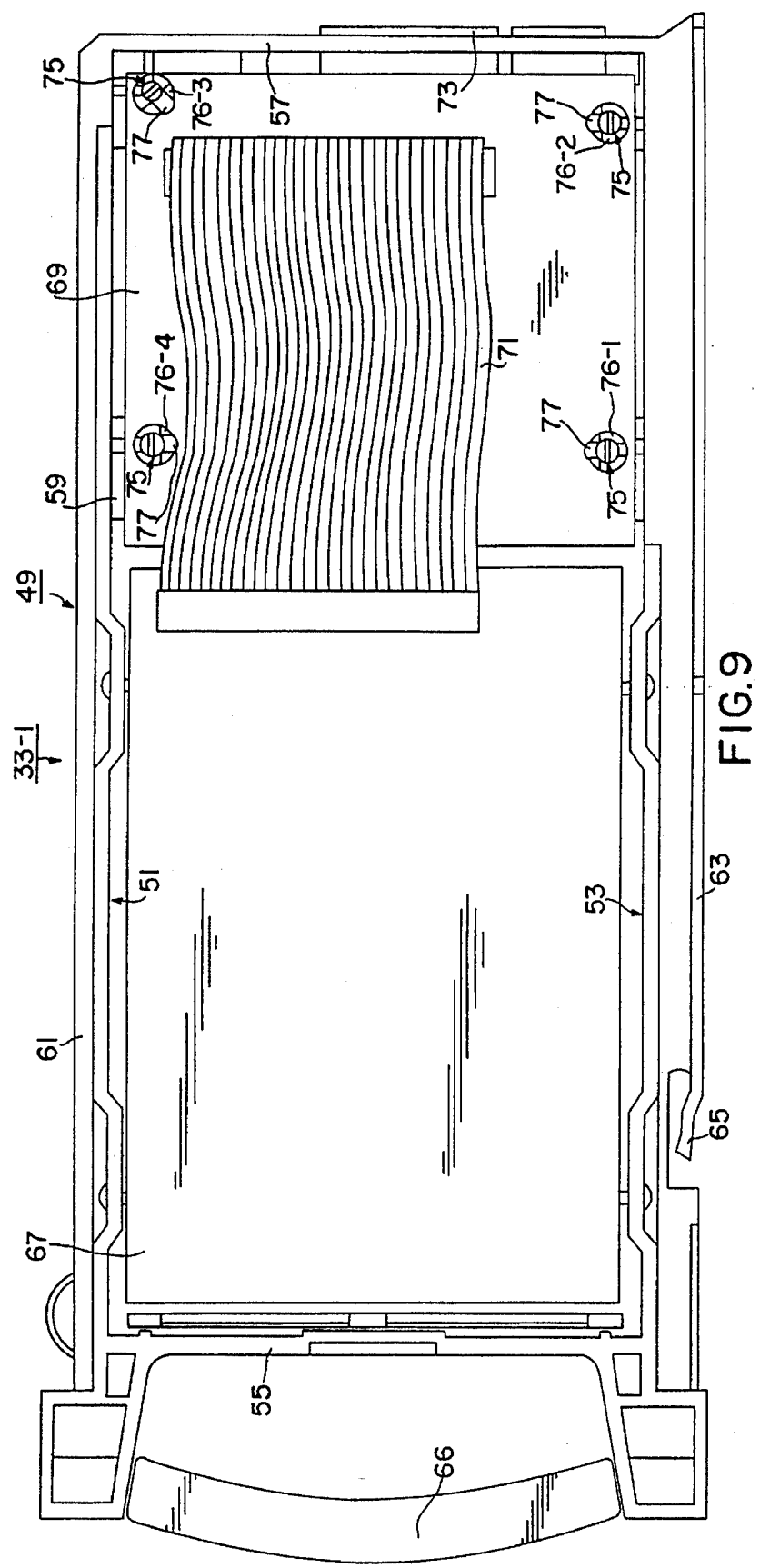
FIG. 9 is a right side view of one of the disk drive modules shown in FIG. 1.
Figure 10:
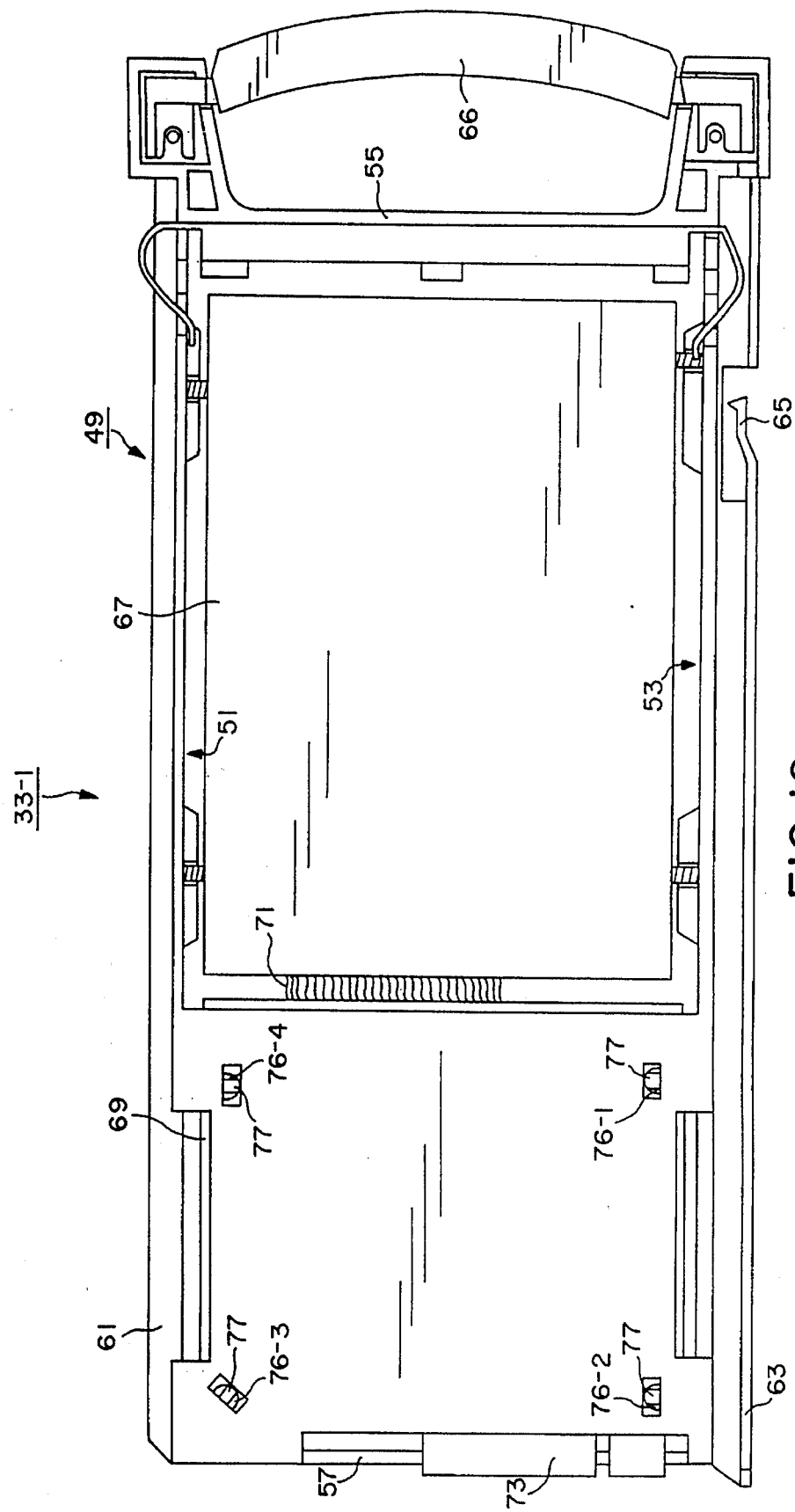
FIG. 10 is a left side view of the disk drive module shown in FIG. 9.

Referring now to FIG. 8, there is shown a front view of backplane 31. As can be seen, a plurality of electrical connectors 45-1 through 45-20 are disposed on the front side of backplane 31, each for use with one of the disk drive modules 33. A plurality of holes 47 are provided on backplane 31 through which air drawn by fans 25 may pass to cool the inside of chassis 13. Backplane 31 is fixedly mounted within chassis 13 by means of a supporting bracket (not shown).

Figure 15:
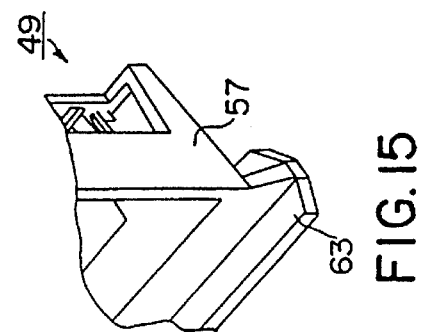
FIG. 15 is a fragmentary perspective view, taken from the rear, of the frame shown in FIG. 13.

Referring now to FIGS. 9–12, disk drive module 33-1 is shown in greater detail. As can be seen, module 33-1 includes an elongated, generally rectangular, unitary frame 49 (see also FIGS. 13 through 15 wherein frame 49 is shown separately). Frame 49 includes a top wall 51, a bottom wall 53, a front wall 55, a rear wall 57, and a side wall 59. Top wall 51 includes a longitudinally extending fin 61 and bottom wall 53 includes a longitudinally extending T-bar 63. To mount a disk drive module 33 in chassis 13, T-bar 63 is slidably inserted into a channel 39 on first disk drive module guide plate 35, and fin 61 is slidably inserted into a corresponding groove 43 on second disk drive module guide plate 37. (T-bar 63, fin 61, channel 39, and groove 43 are chamfered as shown to facilitate insertion.)

Figure 16:
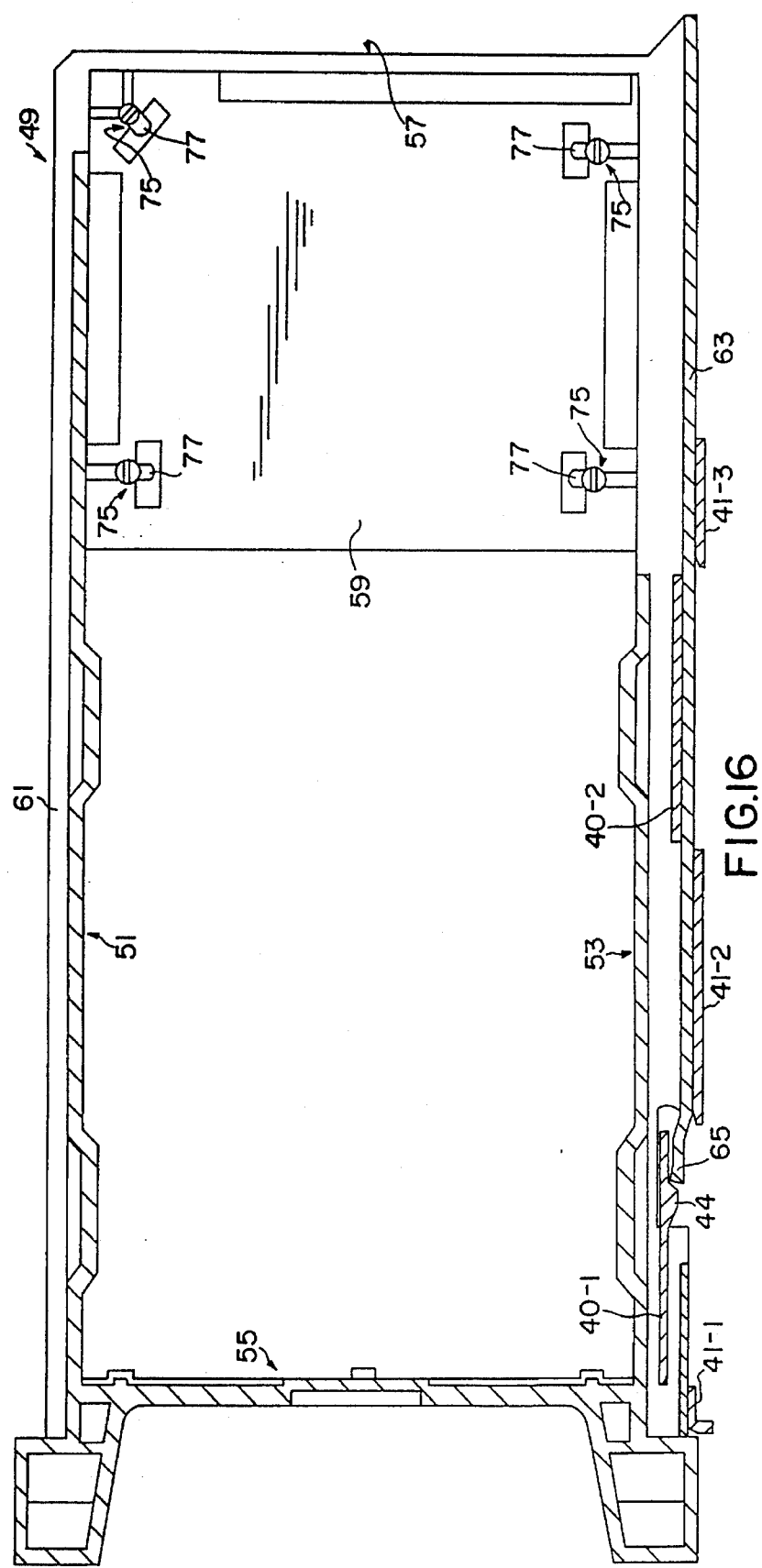
FIG. 16 is a section view showing the disk drive module of FIG. 9 mounted and secured in place on the first disk drive module guide plate of FIG. 3.

To secure disk drive module 33 in place on plate 35, T-bar 63 is shaped to include a detente 65 which slides over pawl 44 once module 33 has been fully inserted into its appropriate channel 39 in first disk drive module guide plate (see FIG. 16). Removal of module 33 from channel 39 once it has been secured thereto with the aforementioned pawl and detente combination is accomplished by pulling module 33 with sufficient force to cause detente 65 to slide back over pawl 44 in the reverse direction.

A handle 66 is fixedly mounted on front wall 55 of frame 49 with an adhesive (not shown) to facilitate insertion and removal of drive module 33 into and out of chassis 13.

In a preferred embodiment of the invention, frame 49 has a top surface length $L_t$ of approximately 290 mm, a bottom surface length $L_b$ of approximately 294 mm, a height h of approximately 135 mm, and a width z of approximately 41.8 mm. In addition, plate 35 has a length L of approximately 198 mm and a width W of approximately 191 mm. Each channel 39 has a width x of approximately 16 mm with adjacent channels 39 being separated by a distance d of approximately 24 mm. When a pair of disk drive modules 33 are mounted in adjacent channels 39 of plate 35, they are separated by a space of approximately 3 mm through which air drawn by fans 25 may pass.

Mounted within frame 49 are a 3.5 inch disk drive 67, a regulator card 69, and a ribbon cable 71. Ribbon cable 71 electrically connects disk drive 67 to regulator card 69.

The rear edge of regulator card 69 includes an edge connector 73 which extends rearwardly a short distance beyond rear wall 52 and is mateable with an electrical connector 45 on the front side on backplane 31. To ensure that edge connector 73 is properly guided into interengagement with an electrical connector 45 when disk drive module 33 is slid into position within chassis 13, regulator card 69 is mounted on frame 49 so that it can move in three directions. This is accomplished by mounting regulator card 69 on bifurcated squeezable snaps 75 through oversized holes 76-1 through 76-4. As can be seen, because holes 76 are oversized relative to snaps 75, regulator card 69 can move in the plane of the card. Each snap 75 includes a tab 77 which serves to limit upward movement of card 69 relative to frame 49. The distance from the bottom of tabs 77 to side wall 59 is greater than the thickness of card 69. Consequently, card 69 can also move in a direction perpendicular to side wall 59.

Figures 11, 12:
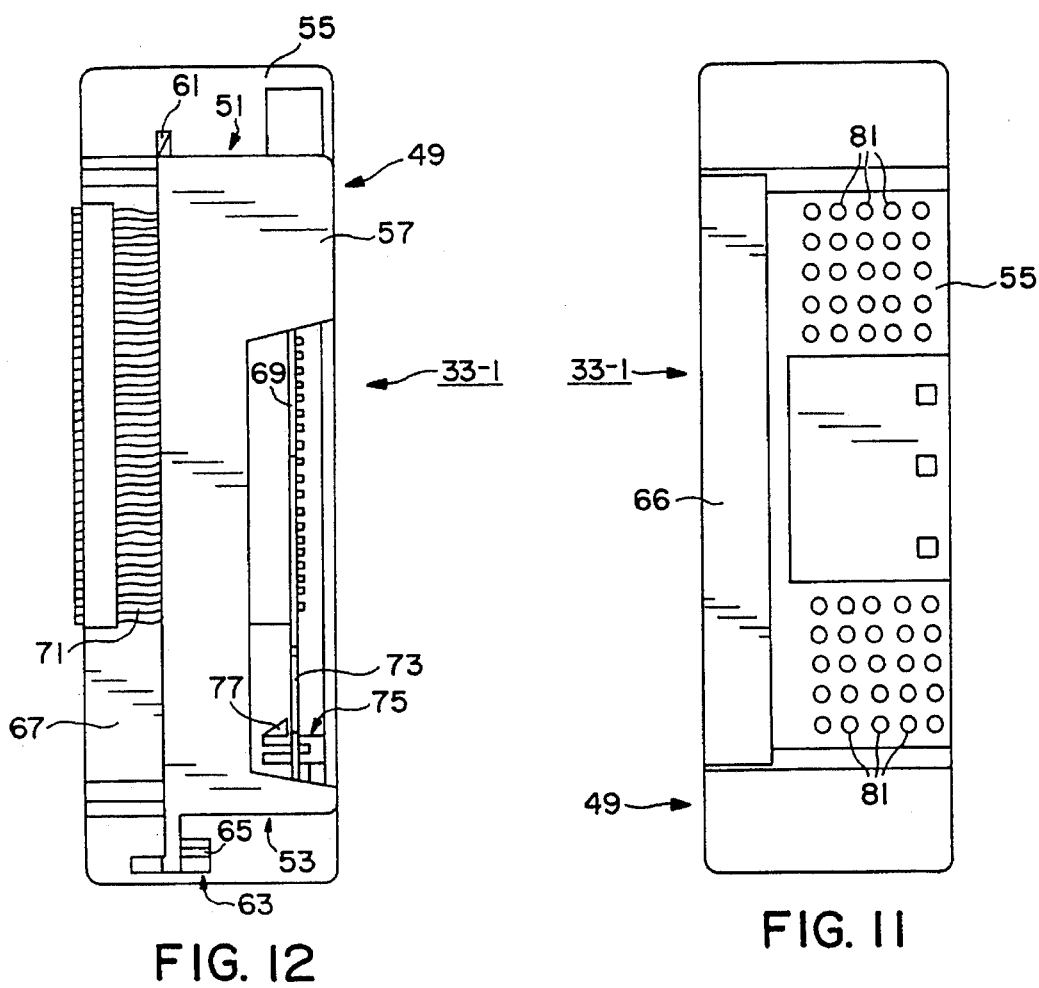
FIG. 11 is a front view of the disk drive module shown in FIG. 9.
FIG. 12 is a rear view of the disk drive module shown in FIG. 9.
Figure 13:
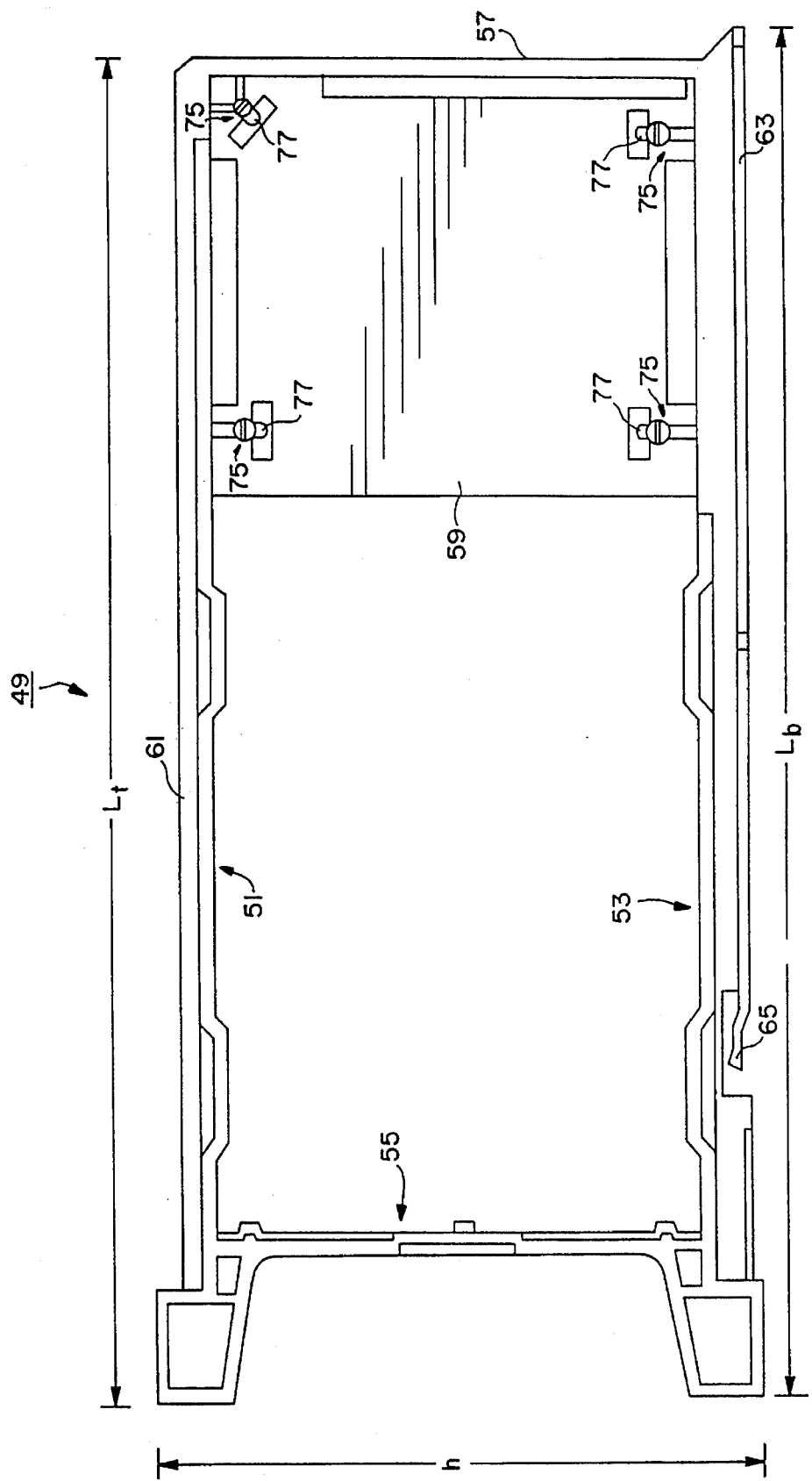
FIG. 13 is a right side view of the frame of the disk drive module shown in FIG. 9.
Figure 14:
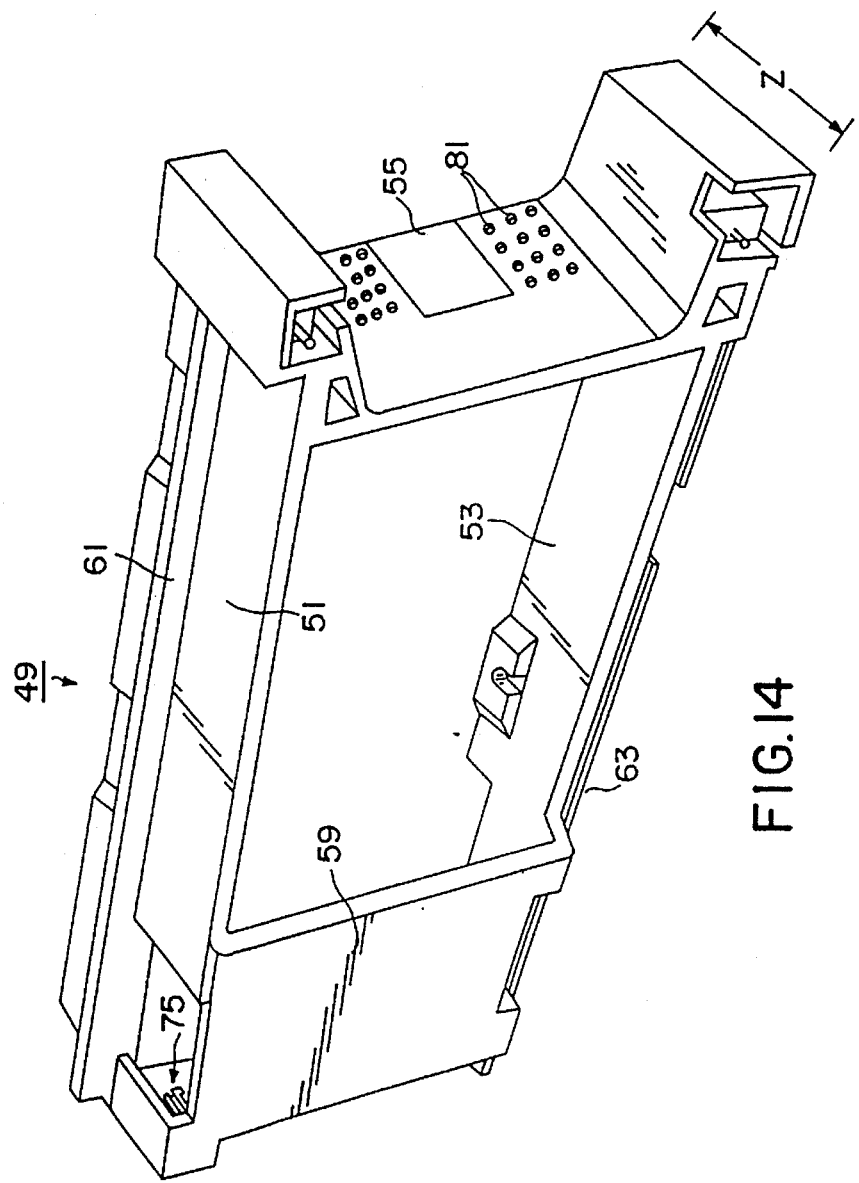
FIG. 14 is a perspective view taken from the left of the frame shown in FIG. 13.

As can be seen best in FIGS. 11 and 14, a plurality of holes 81 are provided in front wall 55 of frame 49 to permit air drawn by fan pack 23 to pass therethrough into chassis 13.

Referring now to FIGS. 17, 18(a) and 18(b), there is shown an empty or filler disk drive module 83 constructed according to the teachings of the present invention.

Filler module 83, which may be inserted into chassis 13 in place of a disk drive module 33 should less than the maximal number of disk drives be needed for operation of subsystem 11, consists of an elongated frame 85 and a handle 87. Frame 85 is identical in construction, shape and size to elongated frame 49 of disk drive module 33. Handle 87, which extends over the entire width of front wall 55, is fixedly mounted on the front end of frame 85 with a suitable adhesive (not shown).

To facilitate installation and/or retrofiting of subsystem 11 into the consoles of various types of data processing systems, subsystem 11 preferably complies with NEMA standards by having an outer length $L_o$ of 19 inches and an outer width $W_o$ of 14 inches.

Figure 19:
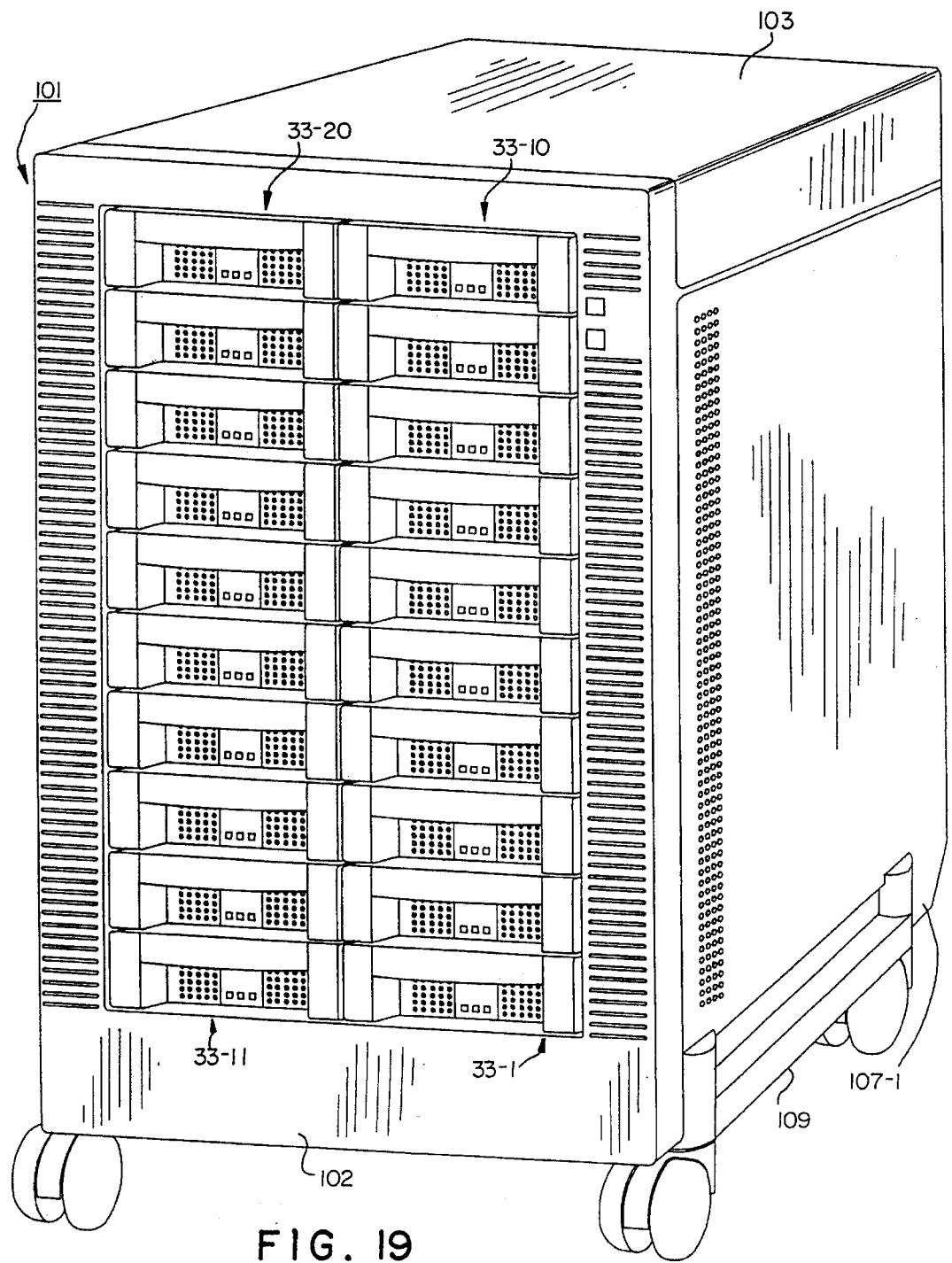
FIG. 19 is a perspective view of a second embodiment of a disk array subsystem constructed according to the teachings of the present invention.

Referring now to FIG. 19, there is shown a second embodiment of a disk array subsystem constructed according to the teachings of the present invention, the subsystem taking the form of a stand-alone tower unit 101.

Figure 20:
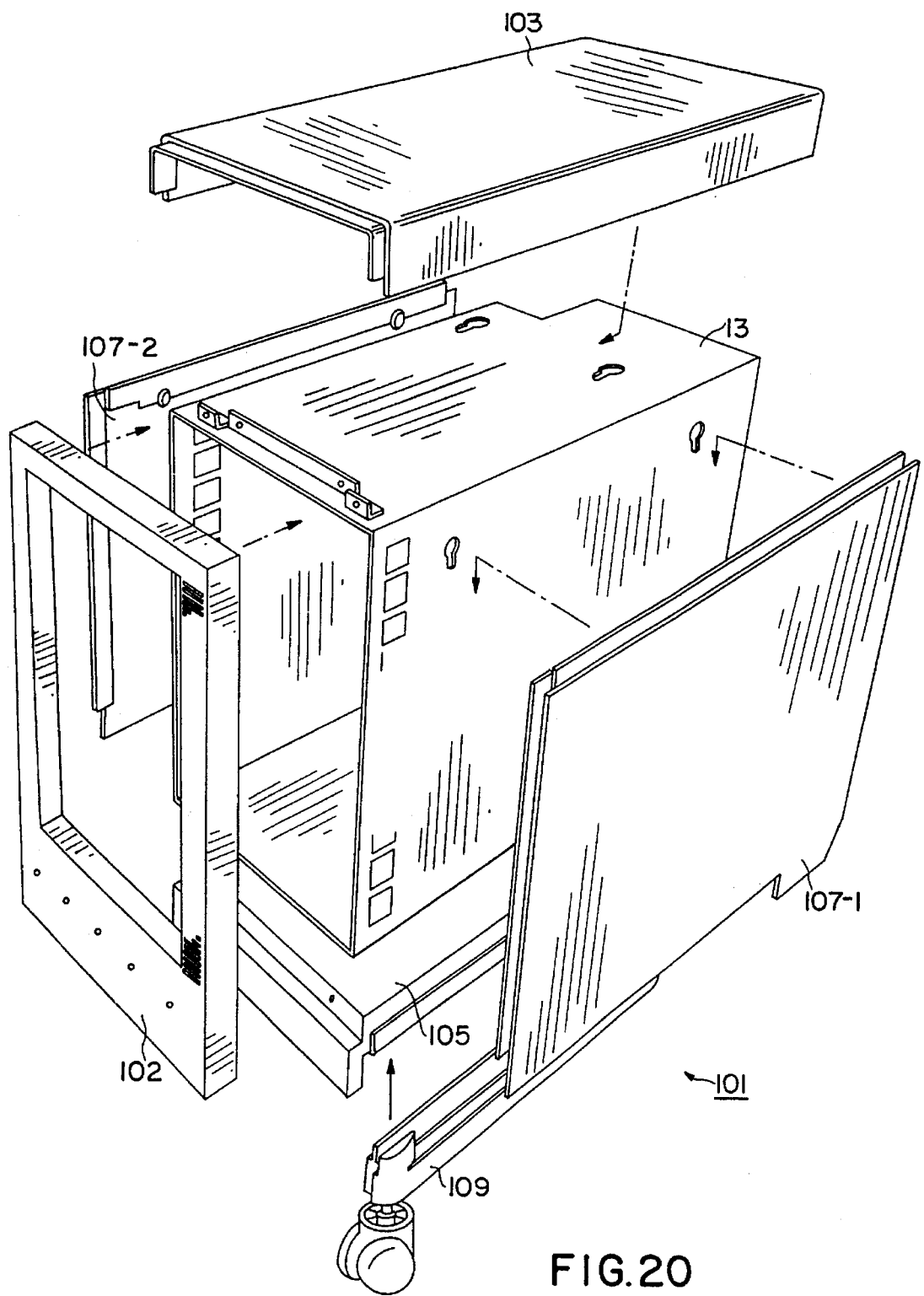
FIG. 20 is an exploded perspective view of the disk array subsystem shown in FIG. 19 with the fan pack and the components of the chassis removed.

An exploded view of tower unit 101 without the various electronic components and fan pack is shown in FIG. 20 and includes chassis 13, front panel 102, a top panel 103, a bottom panel 105, a pair of side panels 107-1 and 107-2, and a frame 109 on casters.

The embodiments of the present invention recited herein are intended to be merely exemplary and those skilled in the art will be able to make numerous variations and modifications to it without departing from the spirit of the present invention. All such variations and modifications are intended to be within the scope of the invention as defined by the claims appended hereto.

What is claimed is:

1. A frame for holding a disk drive and a regulator card, said frame comprising an elongated, generally rectangular, unitary structure shaped to include a front wall, a bottom wall, a top wall, and a side wall, said bottom wall including a longitudinally extending T-bar, said longitudinally extending T-bar including a detent, said top wall including a longitudinally extending fin, said side wall being shaped to include a plurality of snaps for use in mounting said regulator card thereon, each of said snaps being a bifurcated squeezable snap having a tab for limiting movement of the regulator card relative to said wall.

2. The frame as claimed in claim 1 wherein said elongated, generally rectangular, unitary structure has a top surface length of approximately 290 mm, a bottom surface length of approximately 294 mm, a height of approximately 135 mm and a width of approximately 41.8 mm.

3. The frame as claimed in claim 2 wherein said T-bar is sized to be slidably mounted in a channel having a width of about 16 mm.

4. The frame as claimed in claim 3 wherein said front wall is shaped to receive a handle and is provided with a plurality of holes for the passage of air therethrough.

5. A frame for holding a disk drive, said frame comprising an elongated, generally rectangular, unitary structure shaped to include a bottom wall and a top wall, said bottom wall including a guide bar, said elongated, generally rectangular, unitary structure also comprising a front wall, a rear wall and a side wall, said side wall being shaped to include a plurality of bosses for use in mounting a regulator card thereon, each of said bosses being a bifurcated squeezable snap having a tap for limiting movement of the regulator card relative to said side wall.

6. A frame for holding a disk drive, said frame comprising an elongated, generally rectangular, unitary structure shaped to include a front wall, a bottom wall, a top wall, and a side wall, said elongated, generally rectangular, unitary structure having a top surface length of approximately 290 mm, a bottom surface length of approximately 294 mm, a height of approximately 135 mm and a width of approximately 41.8 mm, said bottom wall including a longitudinally extending T-bar, said longitudinally extending T-bar including a detent, said top wall including a longitudinally extending fin, said side wall being shaped to include a plurality of bosses for use in mounting a regulator card thereon, each of said bosses being a bifurcated squeezable snap having a tab for limiting movement of the regulator card relative to said side wall.

7. A frame for holding a disk drive, said frame comprising an elongated, generally rectangular, unitary structure shaped to include a bottom wall a front wall, a rear wall, a side wall and a top wall, said bottom wall including a guide bar, said side wall being shaped to include a plurality of bosses for use in mounting a regulator card thereon, each of said bosses being a bifurcated squeezable snap having a tab for limiting movement of the regulator card relative to said side wall.

8. A frame for holding a disk drive, said frame comprising an elongated, generally rectangular, unitary structure shaped to include a front wall, a bottom wall, a top wall, and a side wall, said elongated, generally rectangular, unitary structure having a top surface length of approximately 290 mm, a bottom surface length of approximately 294 mm, a height of approximately 135 mm and a width of approximately 41.8 mm, said bottom wall including a longitudinally extending T-bar, said longitudinally extending T-bar including a detent, said top wall including a longitudinally extending fin, said side wall is shaped to include a plurality of bosses for use in mounting a regulator card thereon, each of said bosses being a bifurcated squeezable snap having a tab for limiting movement of the regulator card relative to said side wall.

* * * * *